(12) United States Patent
Gogoi et al.

(10) Patent No.: US 8,048,760 B2
(45) Date of Patent: Nov. 1, 2011

(54) SEMICONDUCTOR STRUCTURE AND METHOD OF MANUFACTURE

(75) Inventors: Bishnu Prasanna Gogoi, Scottsdale, AZ (US); Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 0 days.

(21) Appl. No.: 12/833,180

(22) Filed: Jul. 9, 2010

(65) Prior Publication Data

US 2010/0273308 A1 Oct. 28, 2010

Related U.S. Application Data

(62) Division of application No. 12/329,914, filed on Dec. 8, 2008, now Pat. No. 7,777,295.

(60) Provisional application No. 61/012,876, filed on Dec. 11, 2007.

(51) Int. Cl.
*H01L 29/06* (2006.01)
*H01L 21/764* (2006.01)
*H01L 21/768* (2006.01)

(52) U.S. Cl. ........ 438/422; 438/421; 438/411; 438/433; 438/434; 257/506; 257/510; 257/522; 257/634; 257/E29.02; 257/E21.573; 257/E21.581

(58) Field of Classification Search .............. 257/506, 257/510, 522, 634, E29.02, E21.573, E21.581; 438/411, 421, 422, 433, 434
See application file for complete search history.

(56) References Cited

U.S. PATENT DOCUMENTS

| 4,656,497 | A | * | 4/1987 | Rogers et al. ............ 257/397 |
| 6,121,149 | A | * | 9/2000 | Lukanc et al. ........... 438/692 |
| 6,274,920 | B1 | | 8/2001 | Park et al. |
| 6,518,171 | B1 | * | 2/2003 | Towle ....................... 438/624 |
| 7,001,854 | B1 | * | 2/2006 | Papasouliotis et al. ... 438/788 |
| 2002/0052092 | A1 | | 5/2002 | Lachner |
| 2006/0258037 | A1 | | 11/2006 | Fischer et al. |
| 2008/0293214 | A1 | * | 11/2008 | Williams et al. ......... 438/433 |
| 2009/0146248 | A1 | | 6/2009 | Gogoi et al. |

FOREIGN PATENT DOCUMENTS

| JP | 2007273993 A | 10/2007 |
| WO | 2009/076509 A2 | 6/2009 |
| WO | 2009/076509 A3 | 6/2009 |

OTHER PUBLICATIONS

International Search Report and Written Opinion received for PCT Patent Application No. PCT/US2008/086383, mailed on Jul. 27, 2009, 11 Pages.
International Preliminary Report on Patentability received for PCT Patent Application No. PCT/US2008/086383, mailed on Jun. 24, 2010, 6 Pages.
Restriction Requirement received for U.S. Appl. No. 12/329,914, mailed on Mar. 10, 2010, 4 Pages.
Notice of Allowance Received for U.S. Appl. No. 12/329,914, mailed on Jun. 29, 2010, 9 Pages.

* cited by examiner

*Primary Examiner* — Victor A Mandala
(74) *Attorney, Agent, or Firm* — Cool Patent, P.C.; Kenneth J. Cool (57) ABSTRACT

In various embodiments, semiconductor structures and methods to manufacture these structures are disclosed. In one embodiment, a structure includes a dielectric material and a void below a surface of a substrate. The structure further includes a doped dielectric material over the dielectric material, over the first void, wherein at least a portion of the dielectric material is between at least a portion of the substrate and at least a portion of the doped dielectric material. Other embodiments are described and claimed.

31 Claims, 5 Drawing Sheets

SEMICONDUCTOR STRUCTURE AND METHOD OF MANUFACTURE

CROSS-REFERENCE TO RELATED APPLICATIONS

The present application is a divisional of U.S. application Ser. No. 12/329,914 filed Dec. 8, 2008 (allowed). Said application Ser. No. 12/329,914 claims the benefit of U.S. Provisional Application No. 61/012,876, filed Dec. 11, 2007. Said Application No. 61/012,876 and said application Ser. No. 12/329,914 are hereby incorporated herein by reference in their entireties.

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, integrated passive devices may be formed using semiconductor processing technology or it may be desirable to integrate passive devices such as inductors and/or capacitors together with active devices such as transistors using conductive silicon substrates such, as for example, a semiconductor die. However, passive devices may have relatively lower quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices may be reduced. Electrically conductive interconnects or busses may be used to electrically couple different devices within the die and external to the die. The frequency of operation may also be reduced by parasitic capacitive coupling between the interconnects and the conductive silicon substrate.

Further, regions of a semiconductor substrate may be physically and electrically isolated from each other. Additionally, some semiconductor devices, such as power transistors, provide a relatively higher output power, which may be utilized in some RF, industrial, and medical applications. Power transistor designers are continually seeking ways to efficiently increase output power by varying the output voltage and current characteristics of a power transistor. For example, a power transistor may have an increased breakdown voltage to enable the power transistor to operate at a relatively higher voltage and provide a relatively higher output power.

For simplicity of illustration and ease of understanding, elements in the various figures are not necessarily drawn to scale, unless explicitly so stated. Further, if considered appropriate, reference characters have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not be in contact with each other and may have another element or elements in between the two elements.

Figure 1:
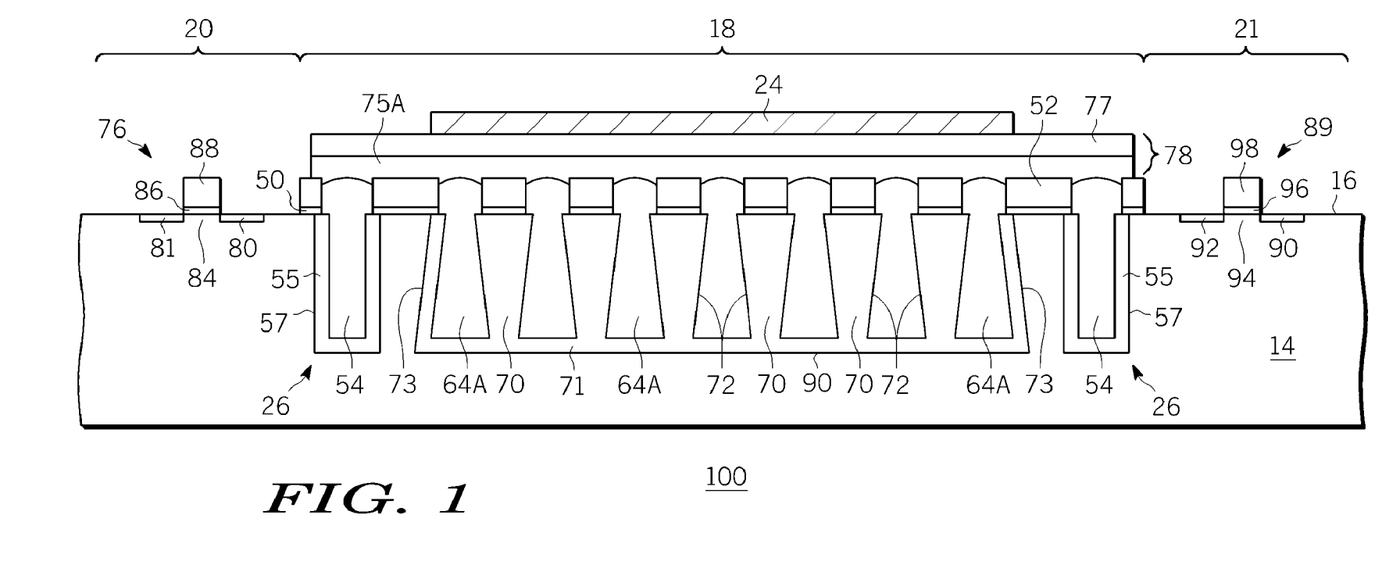
FIG. 1 is a cross-sectional view of a semiconductor structure in accordance with one or more embodiments.

FIG. 1 is a cross-sectional view of a semiconductor structure 100 that illustrates a dielectric platform ("DP") 18, active regions 20 and 21, and an electrically conductive material 24 in accordance with one or more embodiments. Dielectric platform 18 may be referred to as a dielectric structure or a dielectric region, and active regions 20 and 21 may also be referred to as active area regions, active areas, or portions of active areas since active devices, or portions of active devices, typically are formed in active regions 20 and 21.

Dielectric platform 18 of semiconductor structure 100 comprises a plurality of dielectric structures 70 such as, for example, pillars or columns 70 formed in a substrate 14 having a boundary or top surface 16. Although not shown, substrate 14 also has an opposing boundary or bottom surface that is parallel to, or substantially parallel to, top surface 16. In other embodiments, dielectric structures 70 may be elongated walls and may also be referred to as protrusions, projections, or partitions. Dielectric structures 70 may comprise silicon dioxide and may be referred to as vertical structures. Dielectric structures 70 may be part of a dielectric layer or region 71. For example, as is discussed below, in some embodiments, thermal oxidation may be performed to convert a portion of substrate 14 to silicon dioxide, thereby forming silicon dioxide layer or region 71 which includes structures 70. In addition to dielectric region 71, dielectric platform 18 shown in FIG. 1 includes a capping structure 78, a sealed cavity 64A, and dielectric layers 50 and 52. Optionally, dielectric platform 18 includes a termination structure 26 that comprises a trench 54, a dielectric layer 55, and sidewalls 57. Termination structure 26 may also be referred to as a dielectric structure.

Figure 4:
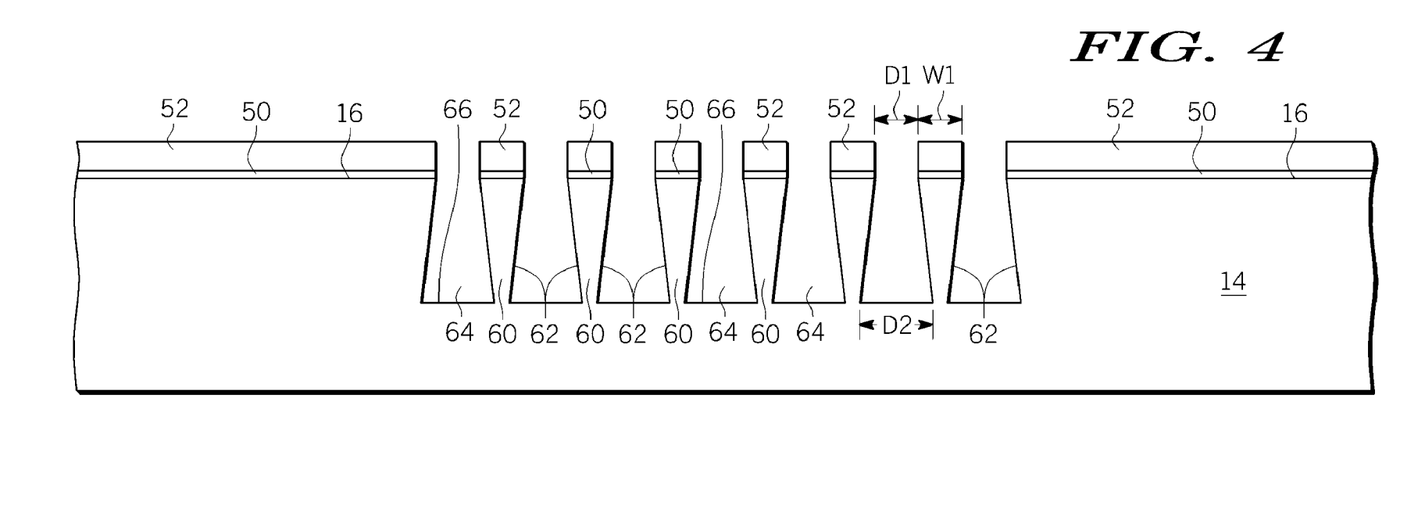
FIG. 4 is a cross-sectional view of the semiconductor structure of FIG. 3 at a later stage of manufacture.

A cavity 64 (FIGS. 4, 5, 6, 7, and 8) having a floor 66 extends from top surface 16 into substrate 14. Structures 60 (FIG. 4) extend from floor 66 towards top surface 16 (FIG. 4). Cavity 64 may also be referred to as a void, a gap, an air gap, an opening, a trench, an empty region, an empty space, or the like. In addition, as described herein, in some embodiments, cavity 64 may be capped, covered, sealed or hermetically sealed to prevent any contamination from undesirable particles, gases, or moisture that may propagate into, or get trapped in cavity 64. When capped, the cavity is identified by reference character 64A and may be referred to as a sealed cavity, a sealed gap, a sealed void, a closed cell, or a closed cell void. In some embodiments, sealed cavity 64A is evacuated to a pressure less than atmospheric pressure. In other words, the pressure in sealed cavity 64A is below atmospheric pressure. As an example, the pressure in cavity 64A may range from approximately 0.1 Torr to approximately 10 Torr. The type of substance or material within sealed cavity 64A is not a limitation of the claimed subject matter. For example, sealed cavity 64A may contain a solid material or a fluid such as a liquid or a gas.

Capping structure 78 is formed over dielectric structures 70 and cavity 64 (FIG. 8) and seals cavity 64 to form a sealed cavity 64A. By way of example, capping structure 78 has a thickness ranging from about 1,000 Angstroms ("Å") to about 4 microns ("µm"). Capping structure 78 is also referred to as a capping layer, and may comprise, for example, a dielectric layer 75A and a dielectric layer 77 on dielectric layer 75A. Layer 75A may be an undoped or doped dielectric material. As will be discussed further below, dielectric layer 75A may be heated to a predetermined temperature to flow or soften layer 75A to seal, hermetically seal, cover, close, or enclose cavity 64 (FIG. 8) to form sealed cavity 64A. In other words, layer 75A may be heated to layer 75A to seal cavity 64, thereby forming sealed cavity 64A. In some embodiments, layer 75A may be a doped glass. For example, layer 75A may be a doped silicate glass such as, for example, phosphosilicate glass (PSG), borosilicate glass (BSG), or borophosphosilicate glass (BPSG). In other embodiments, layer 75A may be an oxide that is doped during or after deposition. For example, layer 75A may be an oxide formed using a deposition process such as, for example, plasma enhanced CVD ("PECVD"), and the oxide may be doped during or after deposition with an impurity material such as, for example, boron or phosphorus. Doping a semiconductor material or a dielectric material with an impurity material such as, for example, phosphorous or boron, or both, can result in a lower viscosity for the material at a given temperature. For example, pure or udoped oxide can flow in the temperate range of about 1300 degrees Celsius (° C.) to about 1400° C. and oxide doped with a 6 to 8 weight percentage (%) of phosphorous can flow at about 1000° C. BPSG can achieve a relatively lower flow temperate of, for example, around 900° C. for a 4 to 5 weight percentage of boron and a 4 to 5 weight percentage of phosphorous. Accordingly, the impurity material alters the reflow characteristics so that the doped dielectric material can be heated to reduce the viscosity of the doped dielectric material to seal the cavity. The flow or reflow process can be performed in vacuum or other ambient which would then make up the ambient within sealed cavity 64A.

Although layer 75A has been described as a doped dielectric material, the methods and apparatuses described herein are not limited in this regard. In other embodiments, layer 75A may be an undoped dielectric material such as, for example, spin-on glass (SOG).

Layer 77 may be a silicon nitride ("$Si_3N_4$") layer. It should be noted that silicon nitride layer 77 is an optional conformal sealing layer that may seal or hermetically seal cavity 64. In other words, the optional conformal silicon nitride layer may fill any openings or cracks in layer 75A, and in general prevent the propagation of gases or moisture into sealed cavity 64A.

In some embodiments, due to the relatively small openings between the upper portions of dielectric structures 70 and between the layers 50 and 52, capping structure 78 may enter into a region above cavity 64, but not fill cavity 64 due in part to the relatively small size of the openings between the upper portions of dielectric structures 70. In some embodiments, sealed cavity 64A may be multiple cavities that are physically isolated from each other. Accordingly, if capping structure 78 or isolated dielectric structures 70 experience a rupture or fracture, this rupture or fracture may be contained in a limited area of dielectric platform 18 due to the physical isolation of the multiple cavities from each other. For example, a closed cell configuration would prevent a fracture or rupture from introducing gas into all of the multiple cavities of dielectric platform 18.

An optional dielectric termination structure 26 comprising a trench 54 having a dielectric layer 55 may be formed in substrate 14. In some embodiments dielectric layer 55 may comprise silicon dioxide. Dielectric termination structure 26 may be part of dielectric platform 18 or may be laterally spaced apart from dielectric platform 18. In other embodiments, trench 54 may be filled with one or more dielectric materials (not shown) such as, for example, an oxide, a nitride, or undoped polysilicon. Termination structure 26 has sidewalls 57 that are perpendicular, or substantially perpendicular, to top surface 16 of substrate 14. Termination structure 26 may serve as termination for field lines such as, for example, equipotential lines, during depletion of active devices formed in active regions 20 and 21. Thus, as is discussed further below, equipotential lines impinge on sidewalls 57. In other words, termination structure 26 may provide termination for equipotential lines from an electric field in an active region formed adjacent to termination structure 26. It may be desirable for sidewalls 57 to be straight, or substantially straight, and smooth so that the equipotential lines are substantially perpendicular to sidewalls 57 to achieve a condition referred to as planar breakdown where equipotential lines terminate at a perpendicular angle, or a substantially perpendicular angle, to sidewalls 57. Equipotential lines that impinge on sidewalls 57 at an angle that is not perpendicular to sidewalls 57 may decrease the breakdown voltage of active devices formed in active region 20, active region 21, or both.

As is discussed below, active devices, or portions of active devices, are formed in or from substrate 14. Substrate 14 may comprise a semiconductor material and active regions 20 and 21 may be formed in the semiconductor material of substrate 14. In some embodiments, substrate 14 may comprise silicon and may be referred to as a device layer or an active layer. Further, in some embodiments, substrate 14 may include one or more epitaxial layers. Substrate 14 may include an active area in which active devices, may be subsequently formed. In some embodiments, semiconductor material 14 may be formed on a substrate comprised of the same or a different material. In one example, semiconductor material 14 is silicon which is epitaxially grown on a silicon substrate. A substrate may mean a semiconductor material, one or more epitaxial layers formed on a semiconductor material, a semiconductor material disposed on an insulating material, or the like. Substrate 14 may also be referred to as a semiconductor substrate. Active devices may be formed in active regions 20 and 21 using conventional complementary metal oxide semiconductor ("CMOS"), bipolar, or bipolar-CMOS ("BiCMOS") processes.

In some embodiments, the depth or thickness of dielectric platform 18 may range from about one µm to about 100 µm and the depth of dielectric platform 18 may be measured from top surface 16 of substrate 14 to a lower boundary or surface 90 of dielectric platform 18. In some embodiments, lower surface 90 of dielectric platform 18 is parallel to, or substantially parallel to top surface 16 of substrate 14. In some embodiments, lower surface 90 of dielectric platform 18 is at a distance of at least about one µm or greater below top surface 16 and the width of dielectric platform 18 is at least about three µm or greater. In other embodiments, lower surface 90 of dielectric platform 18 is at a distance of at least about three µm or greater below top surface 16 and the width of dielectric platform 18 is at least about five µm or greater. In one example, the thickness of dielectric platform 18 may be about ten µm and the width of dielectric platform 18 may be about ten µm. In yet other embodiments, it may be desirable that the thickness of dielectric platform 18 be equal to, or approximately equal to, the thickness of substrate 14, for example, the thickness of the semiconductor die and the width of dielectric platform 18 may be up to about one hundred µm. The thickness and width of dielectric platform 18 may be varied depending on the application for dielectric platform 18 and the desired die size of the resulting semiconductor device that uses substrate 14. For example, a relatively thicker dielectric platform may be desired in applications where dielectric platform 18 is used to form high Q passive devices compared to an application where dielectric platform 18 is used for isolation.

In one or more embodiments, dielectric platform 18 is capable of isolating one or more transistor types from one or more other transistor types, and/or to isolate different regions of substrate 14 including surrounding and/or enclosing one or more areas of substrate 14. For example, in one or more embodiments, dielectric platform 18 may have a ring or annular type shape capable of enclosing or at least partially enclosing an area or region within the ring, to isolate the inner region of the ring from the outer region of the ring. In such an embodiment, active region 20 may be disposed within the interior of the ring formed by dielectric platform 18 to be physically and/or electrically isolated from another active region 21 disposed exterior to the ring formed by dielectric platform 18. Likewise, dielectric platform 18 may comprise other various shapes and/or forms to provide isolation between two or more adjacent regions of substrate 14, and the scope of the claimed subject matter is not limited in this respect.

In some embodiments, the height of dielectric structures 70 is equal to, or approximately equal to, the height of the portion of dielectric region 71 that is below top surface 16 of substrate 14. For example, if lower surface 90 of dielectric region 71 is about three µm below top surface 16, then dielectric structures 70 have a height of about three µm or greater. In other words, if lower surface 90 of dielectric region 71 is at least about three µm or greater from top surface 16 of substrate 14, then dielectric structures 70 extend a distance of at least about one µm or greater from lower surface 90 of dielectric region 71. In one example, lower surface 90 extends to a distance of about one µm from top surface 16 of substrate 14 and dielectric structures 70 have a height of about one µm. Although dielectric structures 70 are illustrated as having a height that is approximately equal to the depth or thickness of dielectric region 71, this is not a limitation of the claimed subject matter. In other embodiments, the height of dielectric structure 70 may be greater than, or less than, the thickness of dielectric region 71. For example, dielectric region 71 may extend a distance of at least about ten µm below top surface 16 and dielectric structures 70 may extend a distance of about seven µm from lower surface 90. Although a plurality of dielectric pillars extending from the floor of a single cavity have been described, it should be noted that a plurality of cavities may be formed in substrate 14. The multiple cavities may be laterally bounded by dielectric walls, dielectric partitions, or the like. In embodiments in which multiple cavities are formed in dielectric platform 18, dielectric platform 18 has a closed-cell configuration in that the cavities of dielectric platform 18 may be physically isolated from each other by the dielectric walls. Accordingly, if there is any rupture or fracture in dielectric platform 18, contamination from any gases in the cavities may be contained in a limited area due to the closed-cell configuration because the multiple cavities of dielectric platform 18 are physically isolated from each other.

Cavity 64A abuts dielectric region 71 and layer 75A. The combination of dielectric material 71 and sealed cavity 64A reduces the overall permittivity of dielectric platform 18 so that dielectric platform 18 has a relatively low dielectric constant. In other words, the combination of dielectric material 71 and sealed cavity 64A results in dielectric platform 18 having a relatively low or reduced dielectric constant. To minimize the dielectric constant of dielectric platform 18, it is desirable to increase the depth of dielectric platform 18, increase the volume of sealed cavity 64A, and reduce the amount of semiconductor material 14 contained in vertical structures 60 (FIG. 4). In some embodiments, a dielectric constant of at least about 1.5 or lower may be achieved by increasing the volume of sealed cavity 64A.

The dielectric constant of dielectric platform 18 is reduced compared to, for example, what would be provided by a dielectric platform that has no cavities or voids. The dielectric constant of dielectric platform 18 may also be reduced by increasing the volume of dielectric material in vertical structures 60 (FIG. 4). Silicon dioxide has a dielectric constant of about 3.9. Accordingly, a solid or filled dielectric structure that includes no cavities and includes silicon dioxide may have a dielectric constant of about 3.9. Since empty space has the lowest dielectric constant (the dielectric constant of empty space is 1), the more empty space or void space incorporated into the dielectric platform, the lower the overall dielectric constant. Accordingly, increasing the volume of sealed cavity 64A relative to the volume of vertical structures 60 (FIG. 4) is more effective in decreasing the dielectric constant of dielectric platform 18 compared to increasing the volume of dielectric material in vertical structures 60 (FIG. 4).

Additionally, less stress is induced in substrate 14 by dielectric platform 18 compared to a solid or filled dielectric structure, because dielectric platform 18 includes substantial volumes that are not occupied by solids having coefficients of thermal expansion that differ from that of substrate 14. A solid or filled dielectric structure (not shown) that includes, for example, an oxide material with no cavities may generate stress in an adjacent silicon region during heating and cooling of the dielectric structure and the silicon region due to the coefficient of thermal expansion ("GTE") mismatch between silicon and oxide. Accordingly, the stress on the silicon lattice may lead to defects or dislocations in the silicon region. The dislocations may lead to undesirable excessive leakage currents in active devices formed in the active region, and therefore, forming a dielectric structure such as dielectric platform 18 which has sealed cavity 64A, can reduce or prevent the formation of dislocations in the adjacent active regions, such as active regions 20 and 21, since sealed cavity 64A can provide relief for the stress. Furthermore, less stress is generated in the formation of dielectric platform 18 compared to a solid or substantially solid dielectric structure in which the solid or substantially solid regions are formed by oxidation because, for example, in silicon, oxidation is accompanied by a 2.2 times volume increase.

In some embodiments described herein, dielectric platform 18 includes one or more cavities occupying in excess of 40% of the total volume of dielectric platform 18. This may result in an effective dielectric constant reduction of about 30% or greater, from a dielectric constant of about 3.9 to an effective dielectric constant of about 2.74. In one embodiment, dielectric platform 18 includes one or more cavities occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 18 may result in dielectric platform 18 having a dielectric constant of about 1.5 or less. As a result, passive elements formed over dielectric platform 18 have reduced parasitic capacitances to substrate 14. The parasitic substrate capacitance is reduced by both the reduced effective dielectric constant of dielectric platform 18 and the increased thickness of dielectric platform 18.

In addition, dielectric platform 18 may be used to increase the frequency of operation of any devices formed using semiconductor structure 100. For example, passive components such as, for example, inductors, capacitors, or electrical interconnects, may be formed over embedded dielectric platform 18 and may have reduced parasitic capacitive and inductive coupling between these passive components and substrate 14 since embedded dielectric platform 18 has a relatively low dielectric constant or permittivity and since embedded dielectric platform 18 increases the distance between the passive components and the conductive substrate. Passive components may also be referred to as passive devices or passive circuit elements. Reducing parasitic substrate capacitances may increase the frequency of operation of any devices formed using a dielectric platform. As an example, the passive component may comprise electrically conductive material 24, wherein electrically conductive material 24 may comprise, for example, aluminum, copper, doped polycrystalline silicon, gold, nickel, or permalloy. In various examples, the passive component may be an inductor, a capacitor, a resistor, an electrical interconnect, or a combination thereof and may be coupled to one or more active devices formed in active regions 20 and 21.

Since at least a portion of dielectric platform 18 is formed in and below the surface of the substrate, dielectric platform 18 may be referred to as an embedded dielectric structure. Embedded may mean that at least a portion of dielectric platform 18 is below a plane (not shown) that is coplanar to, or substantially coplanar to, top surface 16 of substrate 14. In some embodiments, the portion of dielectric layer 18 below the plane extends from the plane to a depth of at least about three μm or greater below the plane and the portion of dielectric platform 18 below the plane has a width of at least about five μm or greater. In other words, at least a portion of dielectric platform 18 is embedded in substrate 14 and extends a distance of at least about three μm or greater from top surface 16 toward the bottom surface of substrate 14 and the portion of dielectric platform 18 embedded in substrate 14 has a width of at least about five μm or greater in some embodiments. In some embodiments, a majority of dielectric platform 18 is below top surface 16 of substrate 14. In other embodiments, all of, or substantially all of, dielectric platform 18 is below top surface 16 of substrate 14.

Further, dielectric platform 18 may be used to form relatively high quality passive devices such as, for example, capacitors and inductors having a relatively high Q since dielectric platform 18 may be used to isolate and separate the passive devices from the substrate. Active devices, such as transistors or diodes, may be formed in regions adjacent to, or abutting, dielectric platform 18, and these active devices may be coupled to passive components such as spiral inductors, interconnects, microstrip transmission lines and the like that are formed on a planar top or upper surface of dielectric platform 18. Increasing the distance between the passive components and substrate 14 allows higher Qs to be realized for these passive components.

As an example, a field effect transistor ("FET") 76 may be formed in active region 20 and a FET 89 may be formed in active region 21. FET 76 may be a MOSFET and may include a source region 81 in a portion of substrate 14, a drain region 80 in a portion of substrate 14, a gate oxide 86 over a portion of substrate 14, a gate 88 over gate oxide 86, and a channel region 84 formed in a portion of substrate 14 under gate oxide 86 and between source and drain regions 81 and 80, respectively. FET 89 may be a MOSFET and may include a source region 92 in a portion of substrate 14, a drain region 90 in a portion of substrate 14, a gate oxide 96 over a portion of substrate 14, a gate 98 over gate oxide 96, and a channel region 94 formed in a portion of substrate 14 under gate oxide 96 and between source and drain regions 92 and 90, respectively. The source, drain, and channel regions of a FET can be formed by forming a doped region in semiconductor substrate 14 and therefore the source, drain and channel regions of a FET may be referred to as doped regions.

As discussed above, substrate 14 may comprise a semiconductor material such as, for example, silicon. Substrate 14 may serve as part of a drain region of a vertical transistor formed in active region 21. In this example, a source contact or electrode (not shown) may be formed on or adjacent to an upper surface of substrate 14 and a drain electrode (not shown) may be formed on or adjacent to a lower surface of substrate 14. During operation, the electrical current flow from the source electrode to the drain electrode in the vertical transistor may be substantially perpendicular to the upper and lower surfaces of semiconductor structure 100. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in United States ("US") patent application having application Ser. No. 10/557,135, titled "POWER SEMICONDUCTOR DEVICE AND METHOD THEREFOR," filed Nov. 17, 2005, which claims priority to Patent Cooperation Treaty ("PCT") International Application Number PCT/US2005/000205 titled "POWER SEMICONDUCTOR DEVICE AND METHOD THEREFOR," having an International Filing Date of Jan. 6, 2005, and an International Publication Date of Jul. 28, 2005, the contents of both of these patent applications are incorporated herein by reference in their entirety.

Power transistors having relatively high breakdown voltages, and consequently relatively high output power, may be realized by forming a vertical transistor in an active area adjacent to dielectric platform 18, as dielectric platform 18 may provide edge termination for the equipotential lines from an electric field in an active area that is adjacent to dielectric platform 18. Higher breakdown voltages may be achieved as the edge termination provided by dielectric platform 18 may reduce curvature of the equipotential lines. As is generally understood, curvature of the equipotential lines results in lower breakdown voltages. To maximize breakdown voltage, the equipotential lines are parallel, or substantially parallel, to top surface 16 of substrate 14, and these equipotential lines are planar with little to no curvature.

If relatively high breakdown voltages are desired, then the lateral sidewall of dielectric platform 18 that contacts the active region is formed to be a dielectric material that is perpendicular, or substantially perpendicular, relative to top surface 16 of substrate 14 to allow the equipotential lines to terminate substantially perpendicular at the lateral sidewall of dielectric platform 18. If the lateral sidewall of dielectric platform 18 is angled relative to top surface 16 of substrate 14, then this may not reduce curvature of the equipotential lines as desired, and therefore, dielectric termination structure 26 that includes trench 54, oxide layer 55, and dielectric sidewall 57 may be included to provide a perpendicular, or substantially perpendicular, dielectric sidewall structure to provide edge termination.

It should be noted that including dielectric termination structure 26 is optional. Termination structure 26 may be desirable in applications where high voltage and/or high power is desired and where the lateral boundaries of dielectric platform 18 do not include a sidewall that is substantially perpendicular to top surface 16 of substrate 14. For example, referring to FIG. 1, the lateral sidewall 73 of dielectric region 71 is angled or tapered, and not perpendicular, to top surface 16 of substrate 14. Accordingly, termination structure 26 may be included to provide a dielectric sidewall 57 that is perpendicular to, or substantially perpendicular to, top surface 16 and is non-parallel, or substantially non-parallel, to the lateral boundary of dielectric region 71.

Dielectric termination structure 26 may be adjacent to, abutting, and/or surrounding, active regions 20 and 21 to provide edge termination for terminating equipotential lines in active regions 20 and 21, which may result in relatively higher breakdown voltages for active devices formed in the active regions.

Similarly, in embodiments where termination structure 26 is omitted, dielectric platform 18 may be adjacent to, abutting, and/or surrounding, active regions 20 and 21 and in these embodiments may provide edge termination for terminating equipotential lines in the active regions, which may result in relatively higher breakdown voltages for some kinds of active devices such as, for example, vertical transistors, formed in the active regions. In addition, if dielectric platform 18 surrounds one or more active regions, then dielectric platform 18 may also be used to provide electrical isolation. For example, dielectric platform 18 may be used to electrically isolate active regions from each other, which may also result in electrical isolation between any active devices formed in the isolated active regions.

Although only a single active device is discussed as being formed in active regions 20 and 21, the methods and apparatuses described herein are not limited in this regard. In some embodiments, a plurality of active devices may be formed in active regions 20 and 21. Further, the types of active devices are not limited to being FETs. Other types of devices that may be formed in active regions 20 and 21 include bipolar junction transistors, junction field effect transistors, insulated gate bipolar junction transistors, diodes, thyristors, passive devices, or the like.

Figure 2:
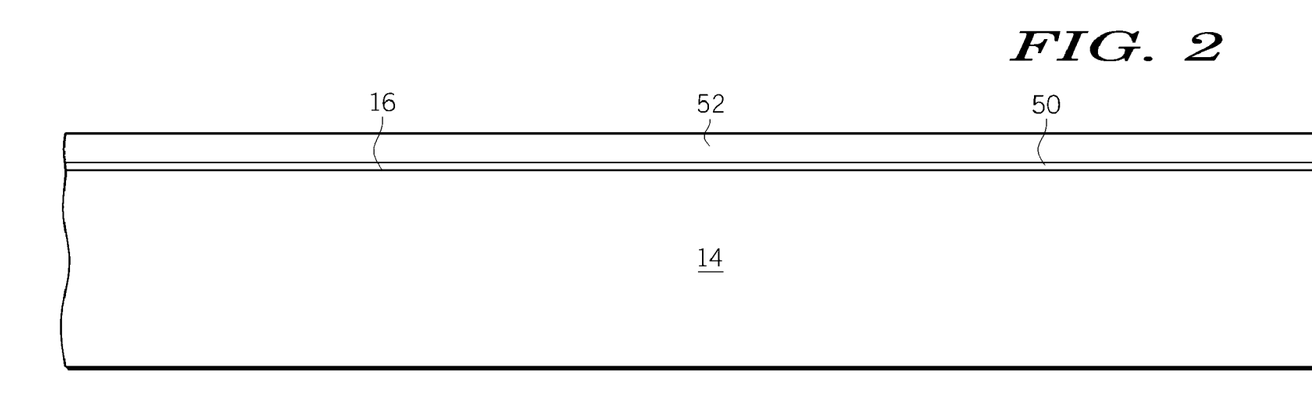
FIG. 2 is a cross-sectional view of the semiconductor structure of FIG. 1 at an earlier stage of manufacture.

FIG. 2 is a cross-sectional view of a semiconductor structure at a beginning stage of manufacture. What is shown in FIG. 2 is substrate 14, which may be used as a substrate for the fabrication of semiconductor structure 100 (FIG. 1). Substrate 14 may comprise a semiconductor material such as, for example, silicon, and may be doped or undoped depending on the application, although the methods and apparatuses described herein are not limited in this regard. Substrate 14 may have a thickness ranging from about 100 µm to about 1,000 µm. However, the thickness of substrate 14 may be reduced through subsequent thinning processes in some embodiments.

A layer of dielectric material 50 is formed on substrate 14. Layer 50 may comprise, for example, silicon dioxide ("$SiO_2$") and may have a thickness ranging from about 100 A to about 5,000 A. Dielectric layer 50 may be formed using deposition techniques or thermal growth techniques such as, for example, thermal oxidation of silicon.

A layer of dielectric material 52 may be formed on dielectric layer 50. Layer 52 may comprise, for example, silicon nitride ("$Si_3N_4$") and may have a thickness ranging from about 100 A to about 10,000 A. In some embodiments, dielectric layer 52 has a thickness that is about two times ("2×") greater than the thickness of dielectric layer 50. Dielectric layer 52 may be formed using low pressure chemical vapor deposition ("LPCVD").

Dielectric layer 52 may be useful as an etch stop, a protective layer, and/or a mask layer during the processing of structure 100. Oxide layer 50 is between substrate 14 and silicon nitride layer 52 to prevent damage that may result from forming silicon nitride layer 52 directly on substrate 14. An advantage of forming dielectric layer 52 as silicon nitride and dielectric layer 50 as silicon dioxide is that the silicon nitride serves as an oxidation barrier during subsequent oxidation steps.

Dielectric layer 52 or a combination of dielectric layer 50 and dielectric layer 52 may serve as a hard mask, and may be referred to as a masking layer. A layer of photo resist (not shown) may be formed over layer 52 to serve as a mask to pattern layers 50 and 52, and substrate 14. Since the photoresist over dielectric layer 52 is also etched as part of the silicon etch used to etch portions of substrate 14, dielectric layer 52 or a combination of dielectric layer 50 and dielectric layer 52 may be used as a hard mask to prevent the undesired etching of the upper surface of substrate 14 during the formation of cavity 64 (FIG. 4). In some embodiments, layers 50 and 52 are optional as masking layers, as in alternate embodiments, the photoresist layer may be made relatively thick such that it is not completely eroded during the etching process, and therefore, the photoresist may be used as a masking layer rather than using layers 50 and 52.

Figure 3:
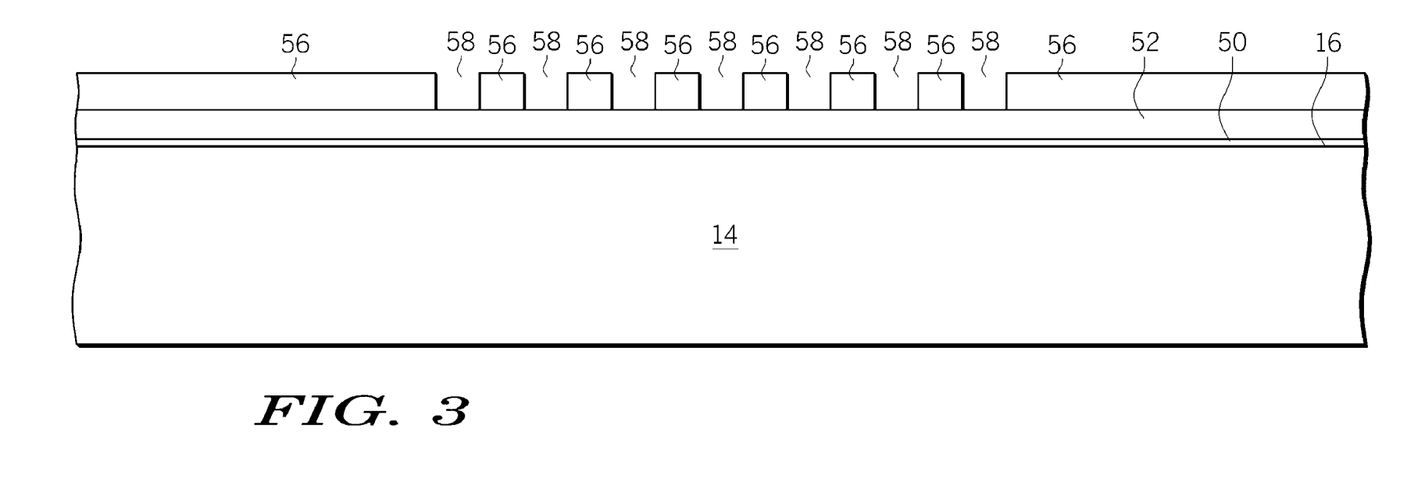
FIG. 3 is a cross-sectional view of the semiconductor structure of FIG. 2 at a later stage of manufacture.

Referring now to FIG. 3, a layer of photoresist is formed on silicon nitride layer 52. The layer of photoresist is patterned to form a masking structure 56 having openings 58 that expose portions of silicon nitride layer 52.

Figure 5:
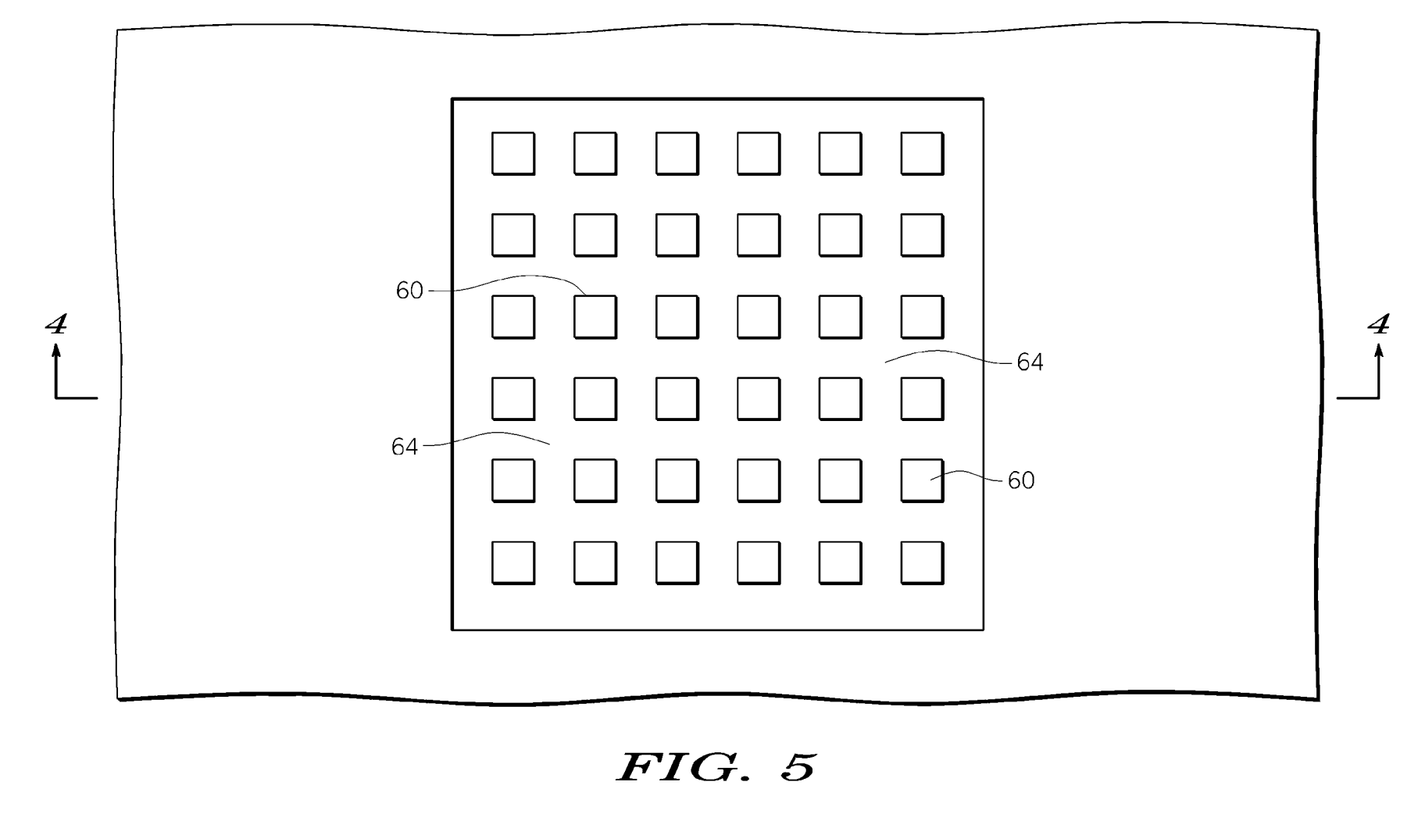
FIG. 5 is a top view of the semiconductor structure of FIG. 4.

FIG. 4 is a cross-sectional side view of the structure of FIG. 3 at a later stage of manufacture. FIG. 5 is a top view of the structure of FIG. 4 in accordance with one or more embodiments, and FIG. 4 is a cross-sectional view taken along section line 4-4 of FIG. 5. With reference to FIGS. 4 and 5, the exposed portions of silicon nitride layer 52 and the portions of silicon dioxide layer 50 and substrate 14 that are below the exposed portions of silicon nitride layer 52 are removed by, for example, etching, to form a plurality of structures 60 having sidewalls 62. In other words, the etch forms a cavity 64 having a floor 66 from which structures 60 extend. Structures 60 extend from floor 66 to top surface 16. Structures 60 may be pillars, columns, or walls and are also referred to as partitions, protrusions, projections, or vertical structures. Although structures 60 are described and shown as pillars herein, the methods and apparatuses described herein are not limited in this regard. Although not shown, as mentioned above, in other embodiments, pillars 60 may be partitions or walls such as, for example, elongated walls. Cavity 64 is also referred to as an opening, void, or trench.

In some embodiments, cavity 64 may be formed using at least one etch operation to remove portions of layers 50 and 52, and substrate 14. In other embodiments, two or three etching operations may be used to form cavity 64. For example, one etch operation may be used to remove portions of layer 50, layer 52, and substrate 14. As another example, three etch operations may be used to remove portions of layer 52, layer 50, and substrate 14.

Silicon nitride layer 52 may be etched using a wet chemical etch or a dry etch process such as, for example, a reactive ion etch ("RIE"). Silicon dioxide layer 50 may be etched using a wet chemical etch or a dry etch process such as, for example, a reactive ion etch ("RIE"). A portion of substrate 14 may next be removed using an etch process such as, for example, reactive ion etching ("RIE").

In some embodiments, the etch chemistry is selected so that sidewalls 62 form an angle that is not perpendicular to top surface 16. For example, sidewalls 62 of structures 60 may be tapered such that the upper portions of structures 60 are wider than the lower portions of structures 60. In other words, the spacing or distance between structures 60 at the upper portions of structures 60 is substantially different than the distance between structures 60 at the lower portions of structures 60. In some embodiments, the distance between the upper portions of structures 60 is substantially smaller, or less than, the distance between the lower portions of structures 60. In FIG. 4, the distance between the upper portions of structures 60 is labeled D1 and the distance between the lower portions of structures 60 is labeled D2. As an example, the distance between the lower portions of structures 60 may be at least about one hundred five percent (105%) or greater than the distance between the upper portions of structures 60. Thus, if the distance D1 is about 1 μm, then the distance D2 is about 1.05 μm or greater. In another example, the distance between the lower portions of structures 60 is at least about one hundred fifty percent (150%) or greater than the distance between the upper portions of structures 60. In other words, the distance between the lower portions of structures 60 is more than about one hundred fifty percent (150%) of the distance between the upper portions of structures 60. Thus, in this example, if the distance D1 is about 1 μm, then the distance D2 is about 1.5 μm or greater. Increasing the distance D2 relative to the distance D1 will further increase the area of empty space in dielectric platform 18, and consequently, will further reduce the effective dielectric constant of dielectric platform 18.

It may be desirable for the depth of cavity 64 to be greater than the width of cavity 64. Thus, in some embodiments the depth of cavity 64 may be at least two times ("2×") greater than the width of cavity 64. Alternatively, the depth of cavity 64 may be at least about ten times ("10×") greater than the width of cavity 64. For example, if the width of cavity 64 is about one μm or less, the depth of cavity 64 may be about ten μm or more.

As stated above, in some embodiments, the etch chemistry is selected so that sidewalls 62 form an angle that is not perpendicular to top surface 16. In some embodiments, trenches with non-vertical sidewalls are formed using reactive ion etching ("RIE"). Using RIE, high aspect ratio (the ratio of depth of the structure to the width of the cavity to be etched) structures 60 may be formed. In one example a series of alternating passivation and etch steps is used which comprise a passivation step that coats all exposed surfaces, an etch step which preferentially removes the passivation in certain regions and then a subsequent etch of the exposed portions. The passivation/etch cycles are repeated to form a high aspect ratio structure. As an example, an initial etch of substrate 14 may be performed to form one or more trenches in substrate 14 and then the passivation step may include forming a passivation layer that comprises a polymer (not shown) using a deposition process that forms the passivation layer along the sidewalls and bottoms of the trenches. The etching step may include a dry etch that preferentially removes the portions of the passivation layer that are at the bottom and lower portions of the trenches. In other embodiments, one or more of the etch process parameters are varied during the process to achieve a specific sidewall profile. Examples of process parameters that can be varied include pressure, etch cycle time, passivation formation cycle time, the amount of precursor used for passivation, the amount of precursor used for etching, and power.

Figure 6:
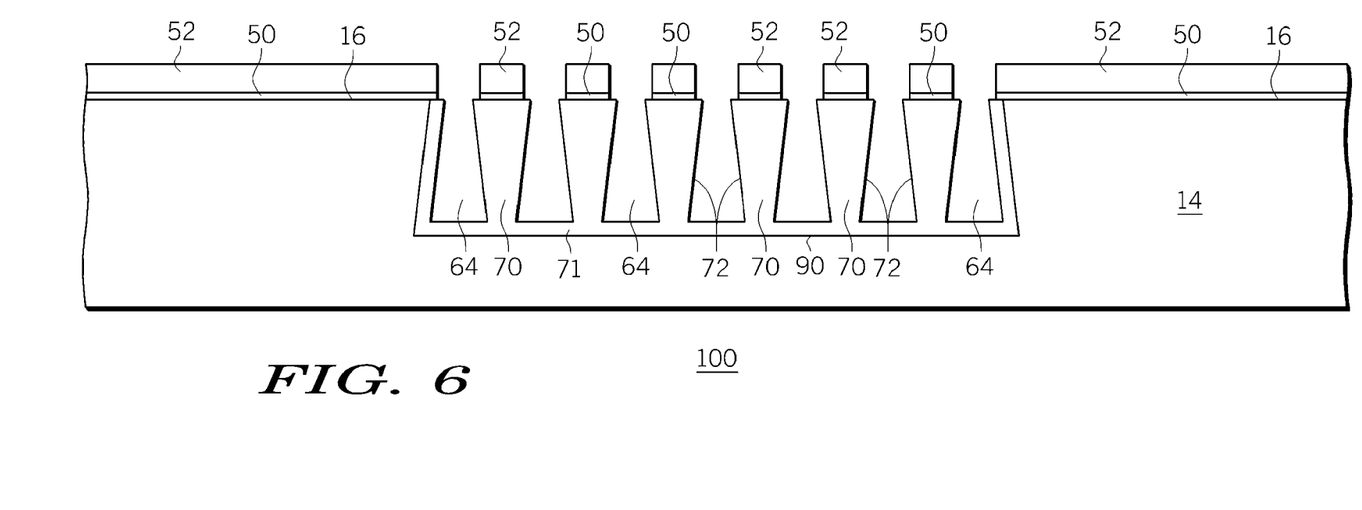
FIG. 6 is a cross-sectional view of the semiconductor structure of FIGS. 4 and 5 at a later stage of manufacture.

As is discussed below with reference to FIG. 6, thermal oxidation is performed to convert a portion of, all of, or substantially all of, the silicon of structures 60 to silicon dioxide to form silicon dioxide structures 70 (FIG. 6). Accordingly, the distance D1 is selected so that after the thermal oxidation, the upper portions of silicon dioxide structures 70 (FIG. 6) are separated from each other and do not contact each other. In some embodiments, the distance D1 ranges from about 0.5 μm to about 2 μm and the distance D2 is at least about 5% greater than the distance D1. The width of the upper portion of silicon structure 60 is labeled W1 and is about 1.5 μm or less in some embodiments. It should be noted that the wider the width W1, the longer it will take to oxidize silicon structure 60. The dimension W1 may be referred to as a diameter depending on the shape of structure 60. In some embodiments, after the thermal oxidation process is performed as is described with reference to FIG. 6 to convert a portion of, all of, or substantially all of, silicon pillars 60 from silicon to silicon dioxide, the distance between the upper portions of silicon dioxide structures 70 (FIG. 6) is about 1 μm or less and the distance between the lower portions of silicon dioxide structures 70 (FIG. 6) is about 1.5 μm or greater. Further, the widths of the lower portions of silicon dioxide structures 70 are substantially smaller than the widths of the upper portions of silicon dioxide structures 70. For example, the widths of the upper portions of silicon dioxide structures 70 are at least about two times ("2×") greater than the widths of the lower portions of silicon dioxide structures 70. In other words, the widths of the upper portions of silicon dioxide structures 70 are more than about two times ("2×") the widths of the lower portions of silicon dioxide structures 70 in some embodiments. For example, if the widths of the upper portions of silicon dioxide structures 70 are about 1.5 μm, then the widths of the lower portions of silicon dioxide structures 70 is about 0.75 μm or less. In some embodiments, the widths of the upper portions of silicon dioxide structures 70 are about four times ("4×") the widths of the lower portions of silicon dioxide structures 70, although the methods and apparatuses described herein are not limited in this regard. As may be appreciated, decreasing the widths at the lower portions of silicon dioxide structures 70 will further increase the amount of empty space in dielectric platform 18 which will result in a dielectric platform with a relatively lower effective dielectric constant.

Masking structure 56 (FIG. 3) is stripped or removed after the removal of portions of layer 52, layer 50, and substrate 14. The oxidation also converts the exposed portions of substrate 14, which are the sidewalls of cavity 64 and structures 60, to silicon dioxide.

Although a square shaped cavity 64 is illustrated in FIG. 5, this is not a limitation of the claimed subject matter. Cavity 64 can have other shapes including a polygonal shape, a circular shape, or the like. In other embodiments, dielectric platform 18 may be formed to surround a portion of substrate 14. Accordingly, cavity 64 may be formed around a portion of substrate 14. This may be desirable to isolate a portion of substrate 14 from another portion of substrate 14 using dielectric platform 18.

FIG. 6 is a cross-sectional view of a semiconductor structure 100 at a later stage of manufacture. A thermal oxidation process is performed so that the exposed silicon of structure 100 is converted to silicon dioxide, thereby forming a silicon dioxide layer or region 71 which includes silicon dioxide structures 70 having sidewalls 72. In particular, the silicon of silicon structures 60 (FIG. 4) may be partially, or in the embodiment illustrated in FIG. 6, completely converted to silicon dioxide to form silicon dioxide structures 70. In other words, the silicon between sidewalls 62 (FIG. 4) of structures 60 may be substantially converted to silicon dioxide in some embodiments. In addition, as shown in FIG. 6 during the thermal oxidation process, the bottom of cavity 64, that is floor 66 (FIG. 4), is also converted to silicon dioxide to form the lower portion of region 71. Since the dielectric constant of silicon is greater than the dielectric constant of silicon dioxide, reducing the amount of silicon in structure 70 will reduce the effective dielectric constant of dielectric platform 18.

About 2.2 units of silicon dioxide are formed from about one unit of silicon during thermal oxidation. In other words, about 2.2 Å of thermal oxide may be formed from about 1 Å of silicon. As a result, the formation of silicon dioxide during the thermal oxidation process illustrated with reference to FIG. 6 has the effect of decreasing the spacing between structures 60 (FIGS. 4 and 5). Thus, the spacing between the resulting silicon dioxide structures 70 is less than the spacing between structures 60 (FIGS. 4 and 5).

As may be appreciated, subsequent capping of cavity 64 may be facilitated by the thermal oxidation process and the initial shape of structures 60 (FIGS. 4 and 5), wherein the upper portions of structures 60 are spaced closer to each other compared to the lower portions of structures 60. In particular, the spacing between the upper portions of structures 60 (FIGS. 4 and 5) is decreased to a distance that will facilitate capping or sealing of cavity 64 using, for example, a non-conformal dielectric material. In addition, the effective dielectric constant of the resulting dielectric platform 18 is reduced due to the initial shape of structures 60 (FIGS. 4 and 5), as the shape of structures 60 allows for increasing the amount of empty space in dielectric platform 18. In other words, the shape of structures 60 allows for decreasing the amount of silicon or silicon dioxide material in dielectric platform 18.

Although the thickness or the amount of the silicon dioxide of silicon dioxide structures 70 is limited after all of the silicon of structures 60 is consumed during the thermal oxidation process, the thermal oxidation process may continue longer to increase the thickness of the silicon dioxide at the lateral and lower boundaries of dielectric platform 18. In other words, the oxidation process may continue longer to increase the amount of silicon dioxide at the bottom of cavity 64 and along the lateral perimeter of cavity 64.

Figure 7:
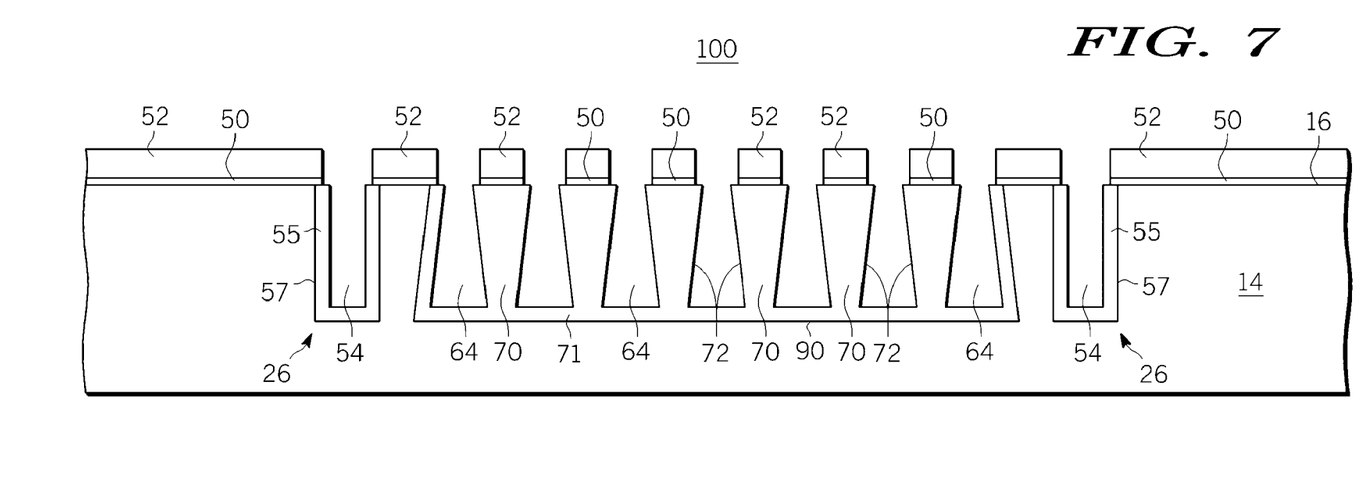
FIG. 7 is a cross-sectional view of the semiconductor structure of FIG. 6 at a later stage of manufacture.

FIG. 7 is a cross-sectional view of semiconductor structure 100 at a later stage of fabrication. After the oxidation process is performed, silicon nitride layer 52, silicon dioxide layer 50, and semiconductor material 14 may be patterned using photolithography and etching processes. Photolithography processes or operations involve the use of masks and may sometimes be referred to as masking operations or acts. The photolithography and etching may include forming a layer of a radiation-sensitive material, such as photoresist (not shown), over structure 100 at the stage of manufacture illustrated in FIG. 6, then exposing the photoresist using, for example, ultraviolet ("UV") radiation to form a mask, and then etching portions of layer 52, layer 50, and semiconductor material 14 using an anisotropic etch process such as, for example, a reactive ion etch ("RIE"), to form a trench 54 that surrounds dielectric platform 18. Trench 54 may also be referred to as a cavity, an opening, a void, a gap, an empty region, an empty space, or the like.

After trench 54 is formed, the photoresist mask (not shown) over structure 100 used to form trench 54 is stripped or removed. Next, a dielectric layer 55 is formed along the sidewall of trench 54. Dielectric layer 55 and trench 54 form a dielectric termination structure 26 as is discussed above. In some embodiments, dielectric layer 55 is an oxide layer such as silicon dioxide having a thickness ranging from about 50 Å to about 5,000 Å. Oxide layer 55 may be formed using deposition techniques or thermal growth techniques such as, for example, thermal oxidation of silicon.

If a thermal oxidation process is used to form oxide layer 55, then other portions of structure 100 may also be affected by the oxidation. For example, the amount of silicon dioxide at the bottom of cavity 64 and along the lateral perimeter of cavity 64 may be increased as part of this thermal oxidation step. Further, in alternate embodiments, structures 60 may be partially oxidized during the initial thermal oxidation described with reference to FIG. 6 so that structures 60 comprise silicon and silicon dioxide and then part of, or all of, the remaining silicon in structures 60 may be further converted to silicon dioxide using the subsequent thermal oxidation process that is used to form oxide layer 55. Accordingly, the thickness of oxide layer 55 and the amount of silicon dioxide at the bottom of cavity 64, along the lateral perimeter of cavity 64, and in structures 70 may be controlled by varying the timing of the two thermal oxidation processes used to form silicon dioxide structures 70 and oxide layer 55.

Figure 8:
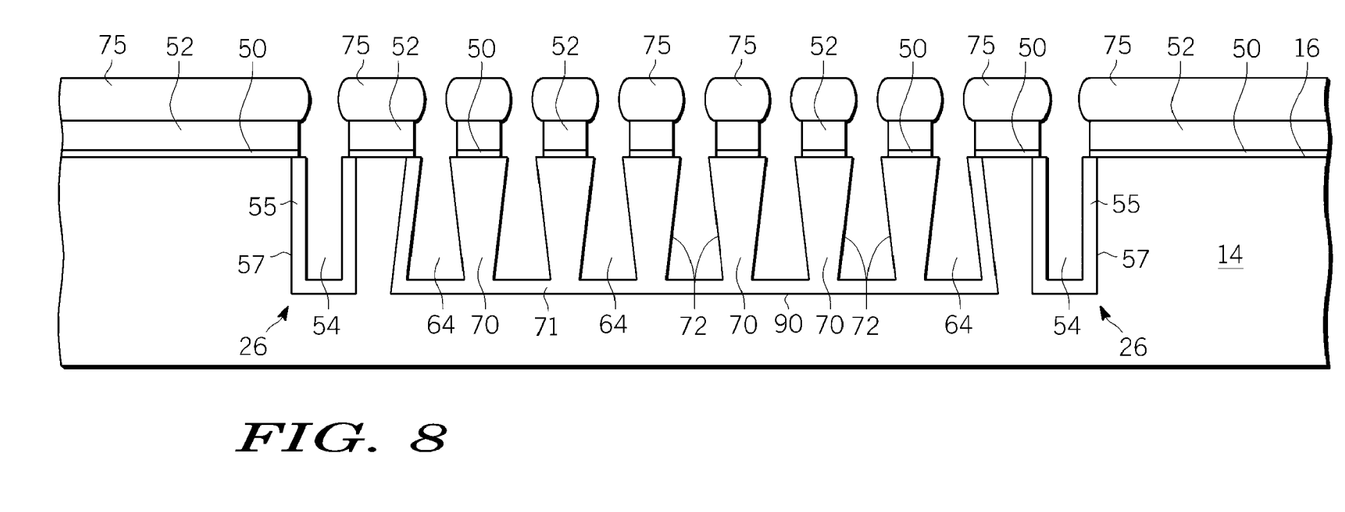
FIG. 8 is a cross-sectional view of the semiconductor structure of FIG. 7 at a later stage of manufacture.

Referring now to FIG. 8, a material 75 is formed over dielectric structures 70. Material 75 can be referred to as a sealing layer, sealing material, capping layer, or capping material. In some embodiments, capping material 75 is a doped dielectric material such as, for example, a doped glass or a doped oxide. Suitable doping or impurity materials for capping material 75 include boron arsenic, phosphorus, or indium. The impurity material can be added during or after the deposition of the dielectric material. As discussed above, the impurity material can alter the flow or reflow characteristics of the doped dielectric material.

In some embodiments, capping material 75 may be phosphosilicate glass ("PSG"), borosilicate glass ("BSG"), or borophosphosilicate glass ("BPSG"). Techniques for forming capping material 75 may include chemical vapor deposition ("CVD"), plasma enhanced CVD ("PECVD"), reduced pressure CVD, sputtering, evaporation, atmospheric pressure chemical vapor deposition ("APCVD"), subatmospheric CVD ("SACVD"), or spin-on deposition. In some embodiments, doped dielectric material 75 is PSG having a phosphorus concentration that ranges from about 4 percent to about 8 percent. In other embodiments, layer 75 may be an oxide that is doped during or after deposition. For example, layer 75 may be an oxide formed using a deposition process such as, for example, plasma enhanced CVD ("PECVD"), and the oxide may be doped during or after deposition with an impurity material or dopant such as, for example, boron or phosphorus. Doping a material with an impurity material such as, for example, phosphorous or boron, or both, can result in a lower viscosity for the material at a given temperature. Although material 75 has been described as a doped dielectric material, the methods and apparatuses described herein are not limited in this regard. In other embodiments, material 75 may be an undoped dielectric material such as, for example, spin-on glass (SOG). In other embodiments, capping material 75 may be any material capable of being reflowed including, but not limited to, polymeric materials.

The embodiment of FIG. 8 shows doped dielectric capping material 75 as discrete or individual mushroom shaped capping structures formed over dielectric structures 70 and over the portions of layer 52 adjacent dielectric structures 70. However, the claimed subject matter is not limited in this regard. For example, although not shown, doped dielectric capping material 75 may form a continuous structure that connects the upper portions of dielectric structures 70 to each other and to the portions of layer 52 adjacent dielectric structures 70. In addition, although not shown, portions of doped dielectric material 75 may be formed along the exposed sidewalls of layers 50 and 52 and/or may be formed along the bottom surface or lower boundary of cavity 64 during the formation of dielectric material 75. However, it may be desirable in some embodiments to limit or minimize the amount of material 75 that is formed in cavity 64.

Figure 9:
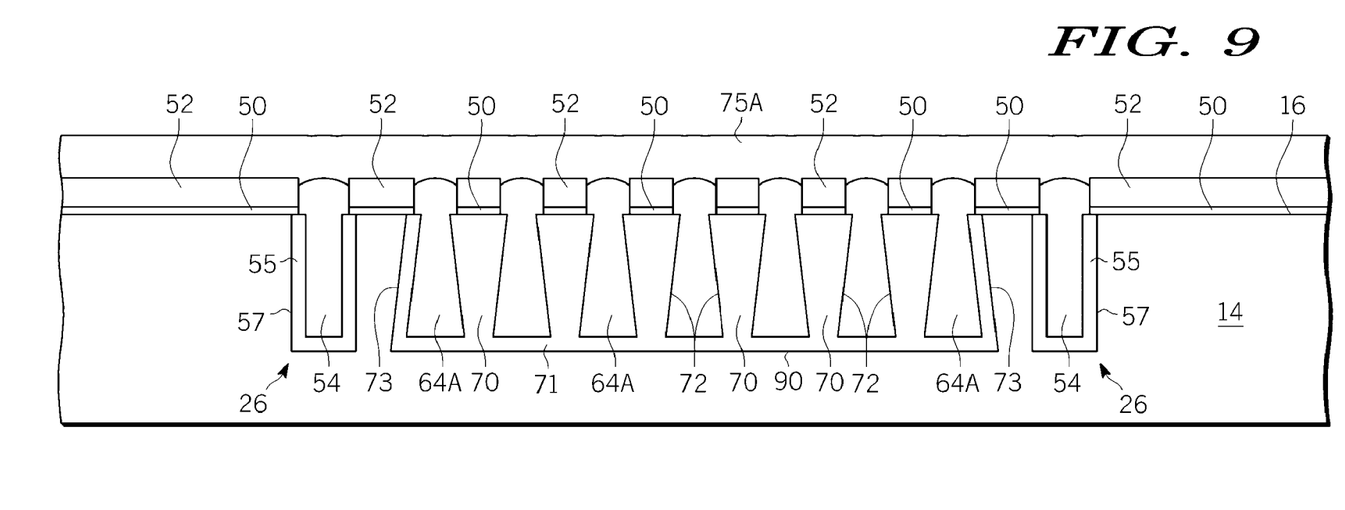
FIG. 9 is a cross-sectional view of the semiconductor structure of FIG. 8 at a later stage of manufacture.

Referring now to FIG. 9, capping material 75 is flowed or reflowed to form a sealed cavity 64A and reflow layer 75A. At least a portion of dielectric material 71 is between at least a portion of substrate 14 and at least a portion of the doped dielectric material 75.

In some embodiments, capping material 75 may be flowed or softened by using thermal energy to cause capping material 75 to flow to seal cavity 64. For example, capping material 75 may be flowed by heating capping material 75 to a temperature sufficiently high to cause it to soften and flow. In other words, material 75 (FIG. 8) may be heated to a temperature sufficiently high to cause it to reflow. In some embodiments, when capping material 75 is a dielectric material, capping material 75 may flow at temperatures ranging between about 950 degrees Celsius (° C.) to about 1,200° C. In some embodiments capping material 75 flows at temperatures below about 1,100° C. The flow or reflow process can be performed in vacuum or other ambient which would then make up the ambient within sealed cavity 64A. As discussed above, sealed cavity 64A may be formed under vacuum.

In addition, in some embodiments, the reflow process can be performed by placing structure 100 in a furnace and the ambient can have a wet steam or have some type of dopant containing gas such as, for example, nitrogen or oxygen, or a mixture of oxygen and nitrogen. Other techniques that can be used as part of the reflow process include laser assisted reflow or spike annealing.

Capping material 75 can also be called a flowable material because of its reflow properties. After capping material 75 has been reflowed, it can also be referred to as a reflow layer 75A. It should be noted that in those embodiments in which capping material 75 is a continuous structure, reflowing may help to smooth the capping material so that the upper surface of layer 75A is planar or substantially planar.

Referring again to FIG. 1, layer 75A may be planarized using, for example, a Chemical Mechanical Planarization ("CMP") technique. It should be noted that planarizing layer 75A is an optional step. An optional sealing layer 77 such as, for example, silicon nitride ("$Si_3N_4$"), may be formed over silicon dioxide layer 75A to hermetically seal cavity 64. In other words, the optional conformal silicon nitride layer 77 may prevent diffusion through and/or fill any openings or cracks in layer 75A, and in general prevent the propagation of gases or moisture into cavity 64A or trench 54 though layer 75A. Silicon nitride layer 77 may be formed using a low pressure chemical vapor deposition ("LPCVD") technique and may have a thickness ranging from about 100 Å to about 1,000 Å. In one embodiment, the thickness of silicon nitride layer 77 is about 500 Å. A partial vacuum may be formed in sealed cavity 64A as part of the LPCVD process. In other embodiments, sealing layer 76 may be LPCVD low temperature oxide (LTO), LPCVD high temperature oxide (HTO), LPCVD TEOS, or LPCVD PSG. If optional sealing layer 77 is used, CMP is performed prior to the formation of optional sealing layer 77 since CMP may completely remove the relatively thin sealing layer 77. Formation of dielectric layer 77 is optional and in those embodiments in which dielectric layer 77 is not formed, layer 75A serves as capping structure 78.

In some embodiments, sealed cavity 64A is evacuated to a pressure less than atmospheric pressure. In other words, the pressure in sealed cavity 64A is below atmospheric pressure. As an example, the pressure in sealed cavity 64A may range from about 0.1 Torr to about 10 Torr. The type of substance or material within cavity 64A is not a limitation of the claimed subject matter. For example, sealed cavity 64A may contain solid matter or a fluid such as a gas or a liquid.

Although a single capped or sealed cavity 64A is described with reference to FIGS. 4-9, the methods and apparatuses described herein are not limited in this regard. In other embodiments, substrate 14 may be etched in such a way as to form multiple isolated cavities. Accordingly, if layer 75A experiences a rupture or fracture, contamination from any gases in sealed cavities 64A may be contained in a limited area due to the physical isolation of the multiple cavities from each other. Capping structure 78 in combination with dielectric structures 70 and sealed cavity 64A form dielectric platform ("DP") 18 shown in FIG. 1.

Referring back to FIG. 1, the portions of capping structure 78, silicon nitride layer 52 and silicon dioxide layer 50 in active regions 20 and 21 are removed after the formation of capping structure 78. Active and passive semiconductor devices may be formed in or from the portions of substrate 14 adjacent dielectric platform 18. In addition, active or passive circuit elements, or portions thereof, may be formed on dielectric platform 18. By way of example, a passive circuit element 24 is formed on dielectric platform 18. In some embodiments, if layer 75A of capping structure 78 is formed prior to the formation of active or passive devices, then subsequently thermal steps used to form the active or passive devices can be at a temperature(s) below the temperature where layer 75A will flow. In other words, the subsequent elements or devices, such as active or passive devices, can be formed at a temperature, or temperatures, below the temperature used to flow layer 75A. For example, a sufficient quantity of dopant(s) may be added to layer 75A so that layer 75A flows at a temperature of, for example, about 1075° C. to about 1100° C., and then subsequent processing can be performed below 1075° C. in this example. In this example, FETs 76 and 89 can be formed after the formation of layer 75A and at temperatures lower than 1075° C.

In addition, the spatial variation of dopant concentration within an oxide can be controlled to tailor the profile of the oxide after flow. The dopant(s) can be stopped before the end of an oxidation to leave an undoped oxide shell since heavily doped oxides are more susceptible to atmospheric contaminants such as moisture.

Although dielectric platform 18 is described as having one or more cavities 64A, the methods and apparatuses described herein are not limited in this regard. For example, in alternate embodiments, cavity 64A could be filled with a material, such as, for example, a material comprising an oxide, nitride, or silicon if so desired, to form a solid or filled dielectric platform (not shown) that is devoid of any cavities. Such a solid filled dielectric platform would have a relatively higher dielectric constant compared to an air-gap dielectric platform such as dielectric platform 18 since the material used to fill cavity 64A would have a higher dielectric constant compared to a cavity, trench, opening, or void. Examples of materials that may be used to fill, or backfill, cavity 64A may include silicon nitride, polycrystalline silicon, or an oxide material formed using, for example, a hot wall tetraethylorthosilicate ("TEOS") process.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or relatively higher breakdown voltages of any devices formed using, or in conjunction with, a structure that includes the dielectric platform. In addition, the disclosed dielectric platform and the methods for making the dielectric platform may reduce thermal stress that may be imparted to regions adjacent to the dielectric platform compared to other techniques and structures.

Although specific embodiments have been disclosed herein, it is not intended that the claimed subject matter be limited to the disclosed embodiments. Modifications and variations can be made without departing from the spirit of the claimed subject matter. It is intended that the claimed subject matter encompass all such modifications and variations as fall within the scope of the claims.

What is claimed is:

1. A method, comprising: forming a first dielectric material and a cavity on a semiconductor substrate; forming a second dielectric material over the first dielectric material and above the surface of the semiconductor substrate; and heating the second dielectric material to seal the cavity, wherein the second dielectric material is a doped dielectric material.

2. The method of claim 1, wherein the second dielectric material comprises a silicate glass or an oxide.

3. The method of claim 1, wherein the doped dielectric material is phosphorus silicate glass (PSG), boron silicate glass (BSG), boron phosphorus silicate glass (BPSG), or a doped oxide, or combinations thereof.

4. The method of claim 1, wherein the dielectric material is a spin-on glass (SOG) or a polymeric material, or combinations thereof.

5. The method of claim 1, wherein forming the second dielectric material comprises depositing an oxide material over the first dielectric material and above the surface of the semiconductor substrate and doping the oxide with an impurity material during the deposing of the oxide, wherein the impurity material is phosphorous or boron, or combinations thereof.

6. The method of claim 1, wherein the heating comprises heating the second dielectric material to flow the second dielectric material to seal the cavity.

7. The method of claim 1, wherein the heating comprises heating the second dielectric material in an ambient of oxygen, nitrogen, or wet steam, or combinations thereof, to reflow the second dielectric material to seal cover the cavity.

8. The method of claim 1, wherein the heating comprises heating the second dielectric material to soften the second dielectric material to seal the cavity.

9. The method of claim 1, wherein the heating comprises heating the second dielectric material to reduce the viscosity of the second dielectric material to seal the cavity.

10. The method of claim 1, wherein the heating comprises heating the second dielectric material to hermetically seal the cavity.

11. The method of claim 1, further comprising forming a third dielectric material over the second dielectric material to hermetically seal the cavity.

12. The method of claim 10, wherein the first dielectric material comprises silicon dioxide, and the third dielectric material comprises silicon nitride.

13. The method of claim 1, wherein the cavity abuts the first dielectric material and further comprising forming an active device after the heating of the second dielectric material, wherein a portion of the active device is in the semiconductor substrate.

14. The method of claim 12, wherein the portion of the active device is a doped region in the semiconductor substrate.

15. The method of claim 1, further comprising forming an electrically conductive material over the second dielectric material.

16. The method of claim 1, wherein the heating comprises heating the second dielectric material to at least a first temperature or greater to flow the second dielectric material to seal the cavity.

17. The method of claim 16, further comprising forming an active device, wherein at least a portion of the active device is in the semiconductor substrate and wherein the portion of the active device is formed after the heating of the second dielectric material and wherein forming the active device comprises heating the semiconductor substrate to a second temperature or lower, wherein the second temperature is less than the first temperature.

18. The method of claim 1, wherein the semiconductor substrate comprises silicon;
   wherein the forming of the cavity comprises removing a portion of the semiconductor substrate to form the cavity below the surface of the semiconductor substrate;
   wherein the forming of the first dielectric material comprises oxidizing a portion of the semiconductor substrate to form the first dielectric material;
   wherein the first dielectric material abuts the cavity; and
   wherein the semiconductor substrate comprises silicon and the first dielectric material comprises silicon dioxide.

19. A method, comprising:
   forming a dielectric region and a trench below a surface of a semiconductor substrate; and
   forming a doped dielectric material over the dielectric region, above the surface of the semiconductor substrate, and over the trench.

20. The method of claim 19, wherein the doped dielectric material comprises a silicate glass or an oxide.

21. The method of claim 19, wherein the doped dielectric material is phosphorus silicate glass (PSG), boron silicate glass (BSG), boron phosphorus silicate glass (BPSG), or a doped oxide, or combinations thereof.

22. The method of claim 19, further comprising forming a portion of a transistor in the semiconductor substrate adjacent to the dielectric region, wherein the forming of the portion of the transistor occurs after the forming of the dielectric region and the trench.

23. The method of claim 19, further comprising forming a dielectric structure, wherein the dielectric structure is between the dielectric region and the portion of the transistor and wherein forming the dielectric structure comprises forming a second trench in the semiconductor substrate and performing a thermal oxidation process to form a first dielectric material along a sidewall of the trench.

24. A method, comprising:
   removing a portion of a semiconductor material to form a cavity having a lower boundary and a protrusion extending from the lower boundary toward a surface of the semiconductor material, wherein the lower boundary of the cavity is below the surface of the semiconductor substrate;
   altering the lower boundary of the cavity; and
   forming a doped dielectric material over the protrusion.

25. The method of claim 24, wherein the lower boundary is at least about one micron or greater below the surface of the semiconductor material.

26. The method of claim 24, wherein the protrusion abuts the cavity and comprises a dielectric material.

27. The method of claim 24, wherein the protrusion is a pillar, a column, a partition, or a wall, or combinations thereof.

28. The method of claim 24, wherein the semiconductor material comprises silicon and wherein altering the lower boundary of the cavity comprising performing a thermal oxidation to covert a portion of the silicon along the lower boundary of the cavity to silicon dioxide.

29. The method of claim 24, further comprising heating the doped dielectric material to flow the doped dielectric material and to seal the cavity.

30. The method of claim 24, wherein the cavity abuts the doped dielectric material and further comprising:
   forming a first dielectric material over the doped dielectric material;
   forming an electrically conductive material over the first dielectric material; and
   forming a doped region in the semiconductor material spaced apart from, and adjacent to, the cavity, wherein the forming of the doped region occurs after the forming of the cavity.

31. The method of claim 24, wherein the removing comprises remove the portion of the semiconductor material to form the protrusion extending from the lower boundary to the surface of the semiconductor material.

\* \* \* \* \*